United States Patent [19]
Jacobson

[11] Patent Number: 5,264,736
[45] Date of Patent: Nov. 23, 1993

[54] HIGH FREQUENCY RESONANT GATE DRIVE FOR A POWER MOSFET

[75] Inventor: Boris S. Jacobson, Plaistow, N.H.

[73] Assignee: Raytheon Company, Lexington, Mass.

[21] Appl. No.: 874,893

[22] Filed: Apr. 28, 1992

[51] Int. Cl.[5] .................. H03K 17/56; H03K 5/01
[52] U.S. Cl. .................. 307/246; 307/270; 307/282; 307/543; 307/572; 307/268; 328/113; 328/223
[58] Field of Search ............... 307/270, 246, 542–543, 307/282, 261, 572–573, 268; 328/113, 223

[56] References Cited

U.S. PATENT DOCUMENTS

| | | | |
|---|---|---|---|
| 4,438,356 | 3/1984 | Fleisher | 307/571 |
| 4,461,966 | 7/1984 | Hebenstreit | 307/571 |
| 4,565,931 | 1/1986 | Fumey | 307/262 |
| 4,672,327 | 6/1987 | Wittingler | 330/269 |
| 4,767,952 | 8/1988 | Nollet | 307/571 |
| 5,138,515 | 8/1992 | Bourgeois | 307/246 |

FOREIGN PATENT DOCUMENTS 0165429 7/1987 Japan .................. 307/246

OTHER PUBLICATIONS

"A Resonant Pulse Gate Drive for High Frequency Applications," H. L. N. Wiegman, General Electric, Corporate Research & Development, IEEE 0-78-03-0485, Mar. 3, 1992, pp. 738-743.
"A MOS Gate Drive with Resonant Transitions," D. Maksimovic, IEEE 0-7803-0090, Apr. 1991, pp. 527-532.
"Power MOSFET Gate Drive Circuit Provides Clean, Fast Signals," P. M. Koninsky, Power Electronics, PCIM, Jan. 1989, pp. 26, 28.
"Recovering Energy from a Rapidly Switched Gate," JPL Invention Report NPO-17221/6728 by R. S. Janieson, NASA Tech Brief, vol. 14, No. 5, Contract No. NSA 7-918, May 1990, pp. i, 1-4.

Primary Examiner—Margaret R. Wambach
Attorney, Agent, or Firm—Walter F. Dawson; Richard M. Sharkansky

[57] ABSTRACT

An efficient power MOSFET resonant gate drive circuit having a large coupled inductor between and in series with two switching transistors. The inductor prevents cross-conduction from the power bus through the drive transistors as may be caused by simultaneous turn-on due either to switching delays or single-event-upset-radiation from energetic cosmic rays. In either case, the inductor presents a high impedance for current that tries to flow through both transistors simultaneously. A center tap on the inductor is connected to the gate of the power MOSFET. An equivalent inductance resonates with the equivalent capacitance of the gate of the power MOSFET providing fast turn-on of the power MOSFET. During turn-off of the power MOSFET, one drive transistor is switched-off and the other drive transistor is switched-on. The voltage generated by the coupled inductor exceeds the magnitude of the input voltage causing a diode within the off-transistor to turn-on and return energy back to the power source, thereby further increasing the circuit efficiency.

20 Claims, 3 Drawing Sheets

HIGH FREQUENCY RESONANT GATE DRIVE FOR A POWER MOSFET

BACKGROUND OF THE INVENTION

This invention relates to high frequency control of a power field effect transistor and in particular to an improved resonant gate drive circuit for a power MOSFET.

It is known in the prior art of power converters that a gate drive circuit coupled to a power MOSFET contributes to an efficiency reduction of the power converter especially at high frequencies so various driver schemes have been developed. The gate drive power loss is proportional to the switching frequency and is a major limitation in the design of high-efficiency power converters in the MHz region. One approach to improve the gate drive power loss is to use a resonant gate drive circuit as described in a paper entitled "A MOS Gate Drive With Resonant Transitions," by Dragan Maksimovic, 22nd Annual IEEE Power Electronics Specialists Conference (PESC), Jun. 23-27, 1991, pp. 527-532. Maksimovic describes a gate drive that provides quasi-square-wave gate-to-source voltage with low impedance between gate and source terminals in both On and Off states. The equivalent gate capacitance of the power MOS transistor is charged and discharged in a resonant circuit so that energy stored in the equivalent gate capacitance is returned back to the source. However, two other sources of gate drive power losses still remain and they are cross conduction and linear operation. Cross conduction occurs during transitions between the On and Off states of the gate drive transistors. Their simultaneous conduction creates a momentary short circuit of the gate drive power supply. Linear operation losses in the gate drive transistors occur during turn-on and turn-off transitions due to an overlap of drain-to-source voltage and drain current. The larger the equivalent gate capacitance, the longer the gate drive transistors will stay in the linear region.

Another approach for improving gate drive power loss is described in NASA Technical Brief entitled "Recovering Energy from a Rapidly Switched Gate," by Wally E. Rippel, Vol. 14, No. 9, May 1990. A circuit for recovering the energy normally lost by charging and discharging equivalent gate capacitance of field effect transistors, and the like, during high frequency switching is described comprising a special pulse forming logic circuit, a complementary metaloxide semiconductor (CMOS) driver, and a resonating inductor in series with the gate, wherein the logic circuit furnishes a zero-voltage notch of specific length and placement near the beginning and end of the usual square drive signal, whereby the capacitance is resonantly charged and discharged, its energy recovered, and further whereby higher frequency switching is enabled. However, the elaborate pulse-forming logic circuit produces a tolerance-sensitive control signal resulting in production adjustments. Also, cross conduction losses are not addressed by this circuit.

A circuit for high speed control of field effect power transistors comprising a transformer with a primary winding and a secondary winding with an energy storage structure coupled to the secondary for storing energy required for controlling the gates of the field effect power transistors is described in U.S. Pat. No. 4,767,952, issued to Michael Nollet on Aug. 30, 1988. This invention describes a fast transformer-isolated gate drive circuit. Nollet overcomes speed limitation inherent in conventional transformerisolated circuits by inserting an energy storing and signal receiving element between the transformer and the gate of the power MOSFET. While this circuit allows increasing switching speeds without increasing the gate drive current, it does not improve the capacitive power dissipation and cross conduction and linear operation losses in the gate drive transistors.

SUMMARY OF THE INVENTION

Accordingly, it is therefore an object of this invention to provide a high frequency MOSFET gate drive circuit for a power MOSFET.

It is a further object of this invention to provide a higher efficiency resonant gate drive circuit with energy recovery.

It is a further object of this invention to provide a resonant gate drive circuit that eliminates cross conduction (or shoot-thru) power losses and provide protection against single event upset (SEU) radiation.

The objects are further accomplished by providing a resonant gate drive circuit comprising a power source, an inductor having a first winding and a second winding on each side of a center tap, the center tap being coupled to a gate input of a power MOSFET, first switching means coupled between the power source and the first winding of the inductor for providing a path for a first portion of a charging current to the gate input of the power MOSFET and a path for a second portion of a discharge current from the gate input, second switching means coupled between the second winding of the inductor and a ground reference of the power source for providing a path for a second portion of a charging current to the gate input of the power MOSFET and a path for a first portion of a discharge current from the gate input, an input signal coupled to the first switching means and the second switching means for controlling the first switching means and the second switching means, and means coupled to the gate input of the power MOSFET for limiting a voltage level at the gate input to a voltage level of the power source and the ground reference. Each of the first switching means and the second switching means comprises an enhancement mode metal oxide semiconductor field effect transistor (MOSFET). The input signal is coupled to an input gate of each of the enhancement mode MOSFET. The input signal comprises a frequency of 2 MHz. The first winding and the second winding of the inductor comprise an equal number of turns. The limiting means comprises a first diode coupled between the gate input of the power MOSFET and the voltage level of the power source and a second diode coupled between the gate input and the ground reference of the power source. The inductor coupled to the gate input of the power MOSFET forms a resonant circuit with the equivalent gate capacitance of the power MOSFET. The path for the second portion of a discharge current from the power MOSFET gate input provided by the first switching means returns energy to the power source thereby increasing circuit efficiency. The inductor provides a high impedance between the first switching means and the second switching means when the switching means are both conducting simultaneously.

The objects are further accomplished by providing a resonant gate drive circuit comprising, a power source, an inductor having a first winding and a second winding on each side of a center tap, the center tap being coupled to a gate input of a power MOSFET, a first MOSFET having a source and drain coupled between the power source and the first winding of the inductor for providing a path for a first portion of a charging current to the gate input of the power MOSFET and a path for a second portion of a discharge current from the gate input, a second MOSFET having a source and drain coupled between the second winding of the inductor and a ground reference of the power source for providing a path for a second portion of a charging current to the gate input of the power MOSFET and a path for a first portion of a discharge current from the gate input, an input signal coupled to a gate input of the first MOSFET and a gate input of the second MOSFET for controlling the switching of the first MOSFET and the second MOSFET, a first limiting means coupled between the gate input of the power MOSFET and the power source for limiting a voltage level at the gate input of the power MOSFET to the voltage level of the power source, and a second limiting means coupled between the gate input of the power MOSFET and the power source for limiting the voltage level at the gate input of the power MOSFET to the ground reference of the power source. The first MOSFET and the second MOSFET comprises an enhancement mode MOSFET. The input signal comprises a frequency of 2 MHz. The first winding and the second winding of the inductor comprise an equal number of turns. The inductor coupled to the gate input of the power MOSFET forms a resonant circuit with the equivalent gate capacitance of the power MOSFET. The path for the second portion of a discharge current from the power MOSFET gate input provided by the first switching means returns energy to the power source thereby increasing circuit efficiency. The inductor provides a high impedance between the first MOSFET and the second MOSFET when both are conducting simultaneously.

The objects are further accomplished by a method for providing a resonant gate drive circuit with energy recovery comprising the steps of providing a power source, providing an inductor having a first winding and a second winding on each side of a center tap, coupling the center tap to a gate input of a power MOSFET, providing a path for a first portion of a charging current to the gate input of the power MOSFET and a path for a second portion of a discharge current from the gate input with a first switching means coupled between the power source and the first winding of the inductor, providing a path for a second portion of a charging current to the gate input of the power MOSFET and a path for a first portion of a discharge current from the gate input with a second switching means coupled between the second winding of the inductor and a ground reference of the power source, controlling the first switching means and the second switching means with an input signal, and limiting a voltage level at the gate input to a voltage level of the power source and the ground reference with means coupled to the gate input of the power MOSFET. The step of controlling the first switching means and the second switching means with an input signal includes a 2 MHz input signal. The step of limiting a voltage level at the power MOSFET gate input comprises the steps of coupling a first diode between the power MOSFET gate input and the voltage level of the power source and coupling a second diode between the power MOSFET gate input and the ground reference. The step of providing an inductor comprises the step of forming a resonant circuit with the inductor and an equivalent gate capacitance of the power MOSFET.

BRIEF DESCRIPTION OF THE DRAWINGS

Other and further features and advantages of the invention will become apparent in connection with the accompanying drawings wherein.

DESCRIPTION OF THE PREFERRED EMBODIMENT

Figure 1:
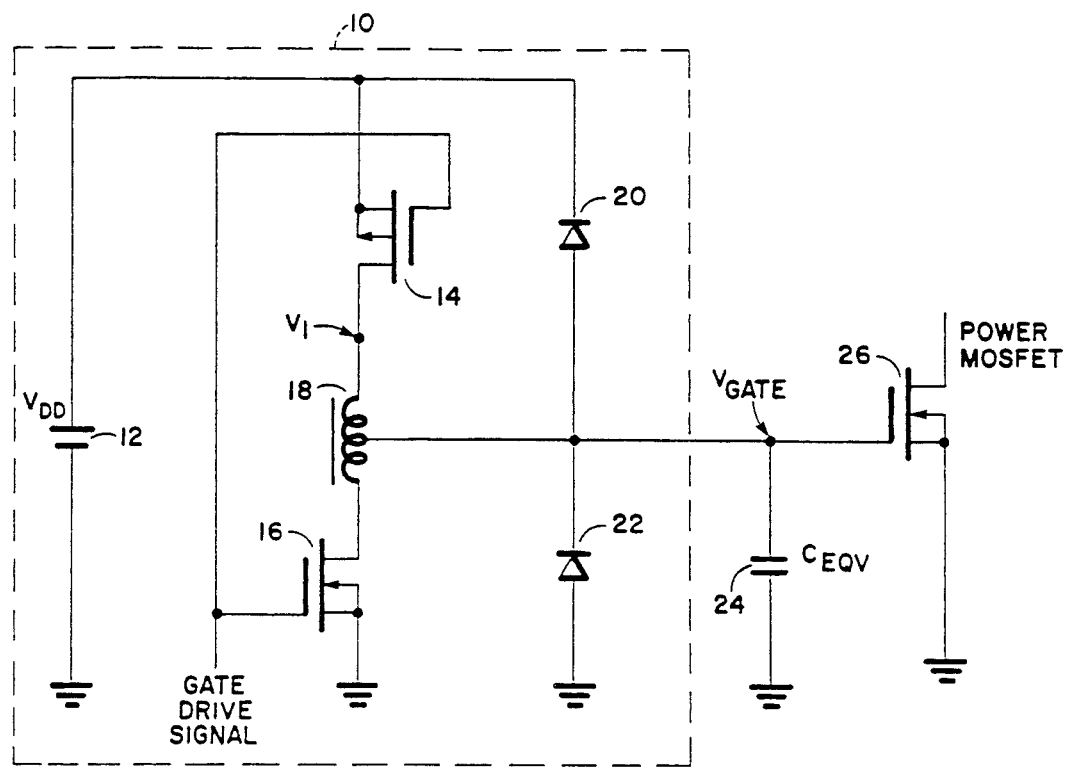
FIG. 1 is a diagram of a high frequency gate drive circuit in accordance with the invention.

Referring to FIG. 1, a circuit diagram of a high frequency resonant gate drive circuit 10 is shown embodying the principles of the invention. The resonant gate drive circuit 10 comprises a complementary pair of enhancement mode metal oxide semiconductor field effect transistors (MOSFET) 14, 16, connected in series with an inductor 18 between them, the inductor 18 having a center tap coupled to a gate of a power MOSFET 26. The inductor 18 comprises an upper half-winding and a lower half-winding on each side of the center tap. A power or voltage source ($V_{DD}$) 12 is also connected to the drain terminal of MOSFET 14. A capacitor ($C_{EQV}$) 24 is shown at the gate of power MOSFET 26 which represents the equivalent gate capacitance ($C_{EQV}$) of the power MOSFET 26 which is very large, typically from 0.5 to 10 nF. In addition, there are two clamping diodes 20 and 22, wherein diode 22 is connected from the gate of the power MOSFET 26 to ground (across $C_{EQV}$ 24) and diode 20 is connected from the gate of the power MOSFET 26 to the voltage source ($V_{DD}$) 12. The diodes 20 and 22 clamp the power MOSFET 26 gate voltage to the $V_{DD}$ and ground levels respectively, thereby improving the gate voltage waveform and protecting the power MOSFET from over voltages. The gates of complementary MOSFETs 14, 16 are connected to a Gate Drive Signal which may have a frequency extending from hundreds of kilohertz to the megahertz range. For the present embodiment shown in FIG. 1 the Gate Drive Signal is 2 $MH_Z$. In most practical circuits a certain amount of parasitic wiring inductance $L_W$ cannot be avoided. As long as the clamping diodes 20 and 22 are located near the power MOSFET 26, the wiring inductance does not adversely affect the circuit's performance. The resonant gate drive circuit 10 employs energy recovery to reduce power loss without adding complex circuitry thereby increasing circuit efficiency and power density.

The inductor 18 performs four major functions in the resonant gate drive circuit 10. First, it eliminates cross conduction (or "shoot-thru") power losses by presenting a high impedance to current flowing from the gate drive power source 12 through both gate drive MOSFETs 14, 16 during their transitions between the ON and OFF states. A circuit protected from such a shoot-thru occurrence is also protected from single event upset (SEU) radiation. Single event upset is a phenomenon caused by energetic cosmic rays resulting in localized ionization in a semiconductor. These conduction paths last for very short periods of time (tens of nanoseconds), but they can cause overheating and permanent damage if the semiconductors are directly connected to a low impedance voltage source. Second, inductor 18 significantly reduces linear operation losses because a fast rising voltage step, as shown in waveform V1 in FIG. 5, across the inductor 18 reduces the time of turn-on and turn-off transitions. This minimizes an overlap of the drain-to-source voltage and drain current and the associated power losses. Third, an equivalent inductance ($L_{EQV}$) which approximately equals L1-M, where L1 is self-inductance of a half-winding of the inductor 18 (both half-windings have the same self-inductance) and M is the mutual inductance, resonates with the equivalent gate capacitance ($C_{EQV}$) 24, thereby performing shaping and limiting for both the charging (turn-on) and the discharging (turn-off) currents without using power-dissipating resistors. Both charging and discharging currents are limited to peak current, $$I_P = V_{DD}/\omega_{EQV} \cdot L_{EQV}, \text{ where } \omega_{EQV} = \sqrt{2/L_{EQV} \cdot C_{EQV}}.$$

Fourth, the coupled windings of the inductor 18 achieve voltage boosting above the level of the gate drive power source ($V_{DD}$) and allow partial return of energy stored in the equivalent gate capacitance 24.

Figure 2:
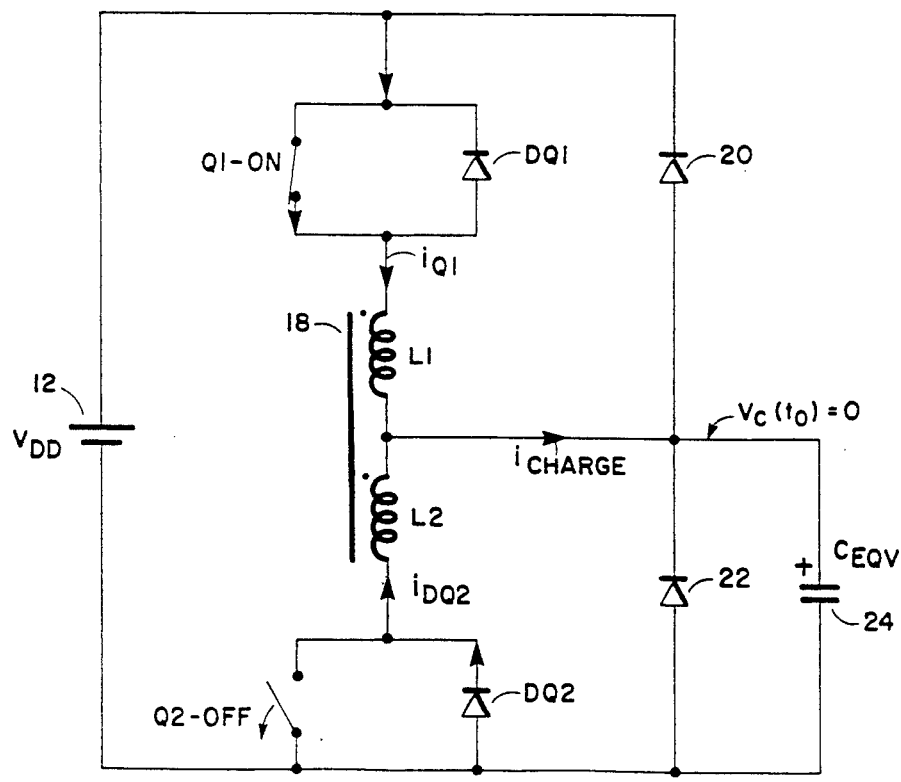
FIG. 2 shows an equivalent circuit for the gate drive circuit at a charge-up transition which corresponds to the turn-on of the power MOSFET.
Figure 3:
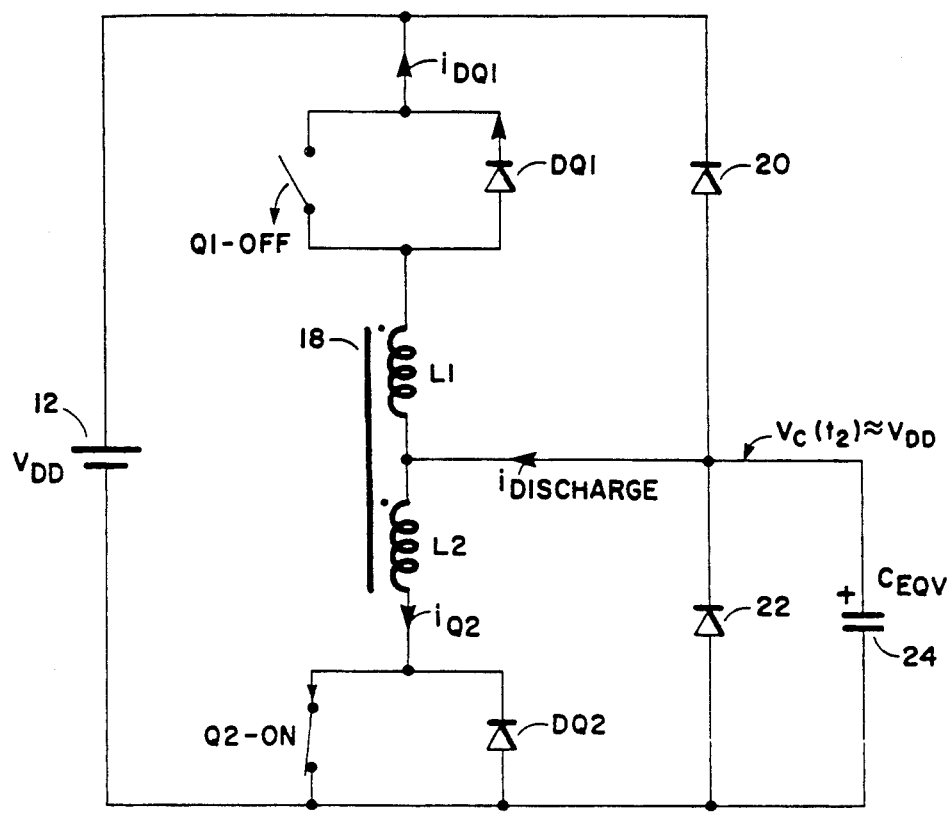
FIG. 3 shows an equivalent circuit for the gate drive circuit at a discharge transition which corresponds to the turn-off of the power MOSFET.

Referring to FIG. 2 and FIG. 3, the operation of the resonant gate drive circuit will be described at two transitions. FIG. 2 shows an equivalent circuit for resonant gate drive circuit 10 at the charge-up transition which corresponds to the turn-on of the power MOSFET 26. FIG. 3 shows an equivalent circuit for the resonant gate drive circuit 10 at the discharge transition which corresponds to the turn-off of the power MOSFET 26. At the instant in time that t=0, MOSFET 14 turns-on providing current $i_{Q1}$ to L1 and MOSFET 16 turns-off. When the MOSFET 14 turns-on, the initial voltage ($V_c(t_0)$) across the equivalent gate capacitance ($C_{EQV}$) 24 equals zero and the voltage $V_{DD}$ is applied to the upper half-winding L1 of the inductor 18. Since the lower half-winding L2 is coupled to L1 and has the same number of turns, a voltage equal to $V_{DD}$ is induced across L2. Thus, the total voltage across the inductor 18 is $2V_{DD}$. When the voltage across an antiparallel diode DQ2 which is an integral part of MOSFET 16 is increased to $2V_{DD}-V_{DD}$, it becomes forward biased and starts to conduct providing current $i_{DQ2}$ to L2.

The equivalent gate capacitance ($C_{EQV}$) 24 is charged by the sum of two currents $i_{Q1}$ and $i_{DQ2}$. Magnetic fields created by these currents in the core of the inductor (L) 18 oppose each other, and they are effectively eliminated from the circuit. The remaining inductance $L_{eqv}$ approaches L1-M. Since this remaining inductance is at least an order of magnitude smaller than the inductance of each half-winding of inductor 18 which in the present embodiment is 400 nH, the equivalent inductance ($L_{EQV}$) resonates with the equivalent gate capacitance ($C_{EQV}$) 24 at high frequency providing a fast turn-on of the power MOSFET 26. When the voltage ($V_{GATE}$) across the gate of the power MOSFET 26 exceeds $V_{DD}+\Delta V_{D20}$ ($\Delta V_{D20}$ being the forward voltage drop of diode 20), the diode 20 starts to conduct and diverts the current from the equivalent gate capacitance ($C_{EQV}$) 24. Thus, while the diode 20 conducts, the voltage $V_{GATE}$ is clamped to the $V_{DD}+V_{\Delta V20}$ level.

Referring to FIG. 3, at the instant in time that $t=t_2$ the discharge transition occurs whereby MOSFET 14 turns-off and MOSFET 16 turns-on providing a path for current $i_{Q2}$. When the MOSFET 16 turns-on, the voltage ($V_c(t_2)$) across the equivalent gate capacitance 24 equals $V_{DD}$ and the voltage is applied to the lower half-winding of the inductor 18. Since the upper half-winding L1 is coupled to L2 and has the same number of turns, a voltage equal to $V_{DD}$ is induced across inductor 18. Thus, the total voltage across inductor 18 is $2V_{DD}$. When the voltage across the antiparallel diode DQ1 is increased to $2V_{DD}-V_{DD}$, it becomes forward biased and starts to conduct providing current $i_{DQ1}$ to the power source 14.

The equivalent gate capacitance ($C_{EQV}$) 24 is discharged by the sum of two currents $i_{Q2}$ and $i_{DQ1}$. Magnetic fields created by these currents in the core of the inductor (L) 18 oppose each other, and they are effectively eliminated from the circuit. The remaining equivalent inductance $L_{eqv}$ approaches L1-M. Since this remaining equivalent inductance is at least an order of magnitude smaller than the inductance of each half-winding of inductor 18, it resonates with the equivalent gate capacitance ($C_{EQV}$) 24 at high frequency providing a fast turn-off of the power MOSFET 26. While the voltage across the inductor 18 exceeds $V_{DD}+\Delta V_{DQ1}$ ($\Delta V_{DQ1}$ being the forward voltage drop of antiparallel diode DQ1), the diode DQ1 stays on and its current ($i_{DQ1}$) partially returns energy stored in the equivalent gate capacitance 24 back to the $V_{DD}$ voltage source 12. When the voltage ($V_{GATE}$) across the gate of the power MOSFET 26 is reduced to $-\Delta V_{D22}$ ($\Delta V_{22}$ being the forward voltage drop of diode 22), the diode 22 starts to conduct and diverts the current from the equivalent gate capacitance ($C_{EQV}$) 24. Thus, while the diode 22 is conducting, the voltage $V_{GATE}$ is clamped to the $-\Delta V_{D22}$ level (below the ground).

Figure 4:
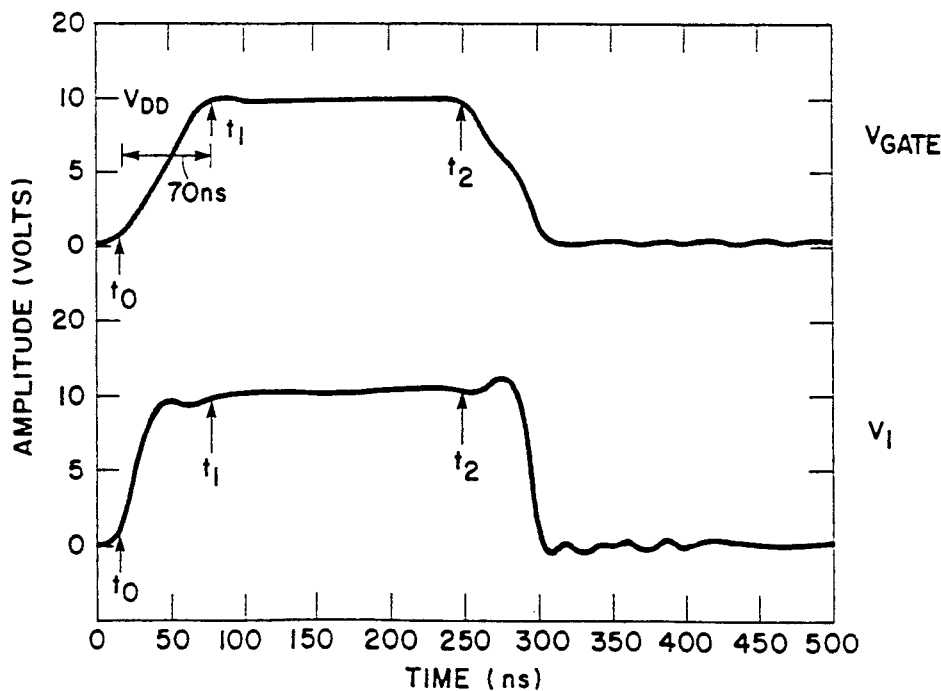
FIG. 4 shows voltage waveforms at the inductor ($V_1$) and at the gate of the power MOSFET ($V_{GATE}$)

Referring to FIG. 1 and FIG. 4, FIG. 4 shows the timing relationship between a $V_1$ voltage waveform at the inductor 18 and a $V_{GATE}$ voltage waveform at the gate of power MOSFET 26. There is a 70 ns delay for $V_{GATE}$ to reach its maximum amplitude at time $t_1$. Time $t_0$ is the start of the charge-up transition as illustrated by the equivalent circuit of FIG. 2 and time $t_2$ is the start of the discharge transition as illustrated by the equivalent circuit of FIG. 3. These voltage waveforms are based on the Gate Drive Signal being a 2 MHz square wave in the preferred embodiment; however, other frequencies and duty cycles are feasible.

Figure 5:
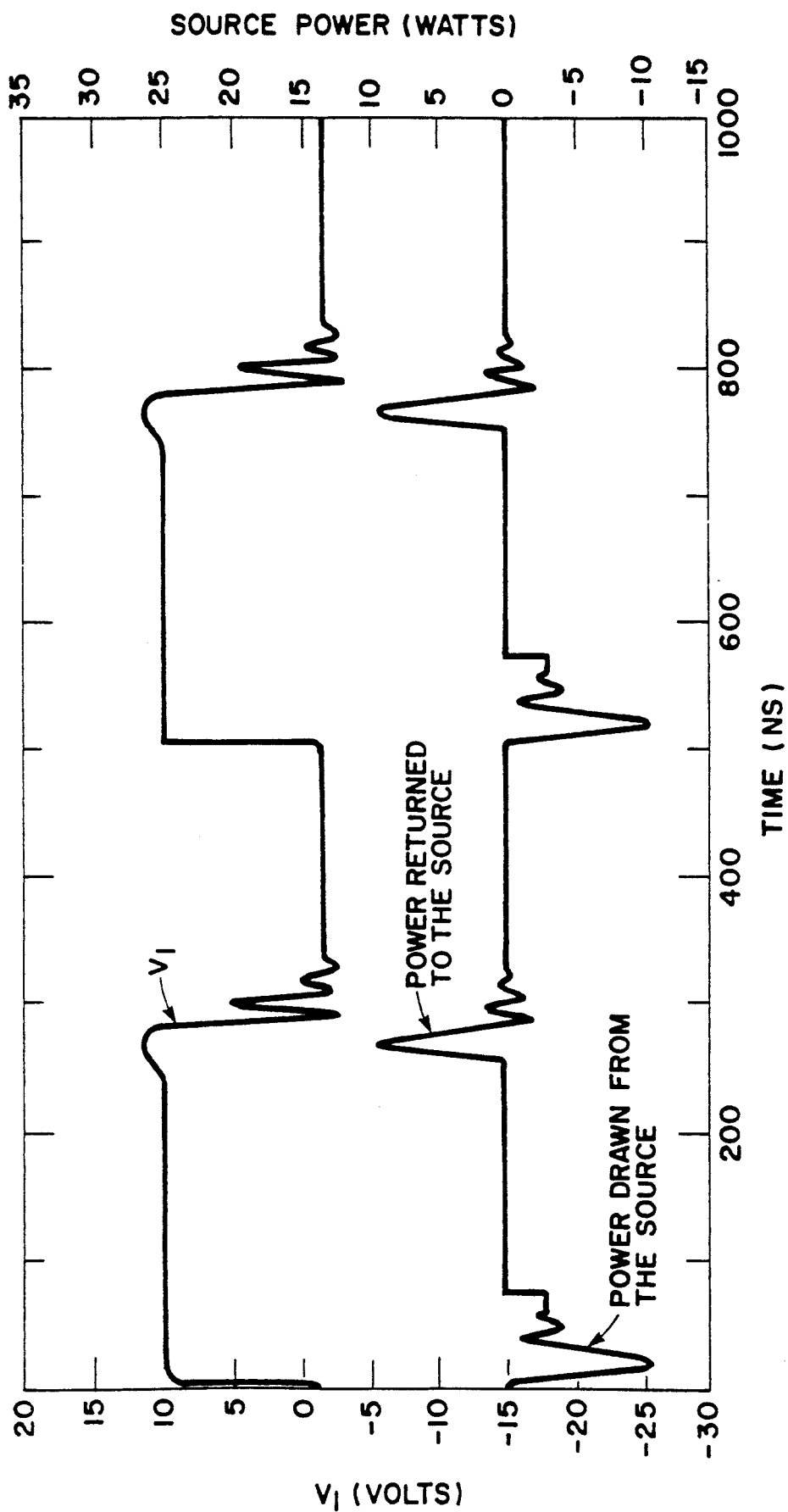
FIG. 5 is a simulated graph of voltage waveform V relative to the source power showing the power drawn from the source and the power returned to the source.

Referring to FIG. 5, a simulated timing design of the relationship between a voltage waveform $V_1$ at inductor 18 and source power is shown. In particular, FIG. 5 shows the power drawn from the power source ($V_{DD}$) when MOSFET 14 is turned-on, and the power returned to the source when MOSFET 14 is turned-off.

Referring to FIG. 1, the circuit components used to implement the preferred embodiment at the 2 MHz switching frequency are as follows: MOSFET 14 may be embodied by part number IRFD 9014 manufactured by International Rectifier of El Segundo, Calif.; MOSFET 16 may be embodied by a MOSFET having part number IFRD 014 manufactured by International Rectifier of El Segundo, Calif.; diodes 20 and 22 may be embodied by Schottky diodes part number PRLL5817 manufactured by Philips Components of Riviera Beach, FL; inductor 18 may be embodied by part number VE44783 (self-inductance of each half-winding is 400 nH, K≈0.92) manufactured by Vanguard Electronics of Gardena, Calif.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

What is claimed is:

1. A resonant gate drive circuit comprising:
   a power source;
   an inductor having a first winding and a second winding on each side of a center tap, said center tap being coupled to a gate input of a power MOSFET;
   first switching means coupled between said power source and said first winding of said inductor for providing a path for a first portion of a charging current to said gate input of said power MOSFET and a path for a second portion of a discharge current from said gate input;
   second switching means coupled between said second winding of said inductor and a ground reference of said power source for providing a path for a second portion of a charging current to said gate input of said power MOSFET and a path for a first portion of a discharge current from said gate input;
   an input signal coupled to said first switching means and said second switching means for controlling said first switching means and said second switching means; and
   means coupled to said gate input of said power MOSFET for limiting a voltage level at said gate input to a voltage level of said power source and said ground reference.

2. The resonant gate drive circuit as recited in claim 1 wherein:
   each of said first switching means and said second switching means comprises an enhancement mode metal oxide semiconductor field effect transistor (MOSFET).

3. The resonant gate drive circuit as recited in claim 2 wherein:
   said input signal is coupled to an input gate of each of said enhancement mode MOSFET.

4. The resonant gate drive circuit as recited in claim 1 wherein:
   said input signal comprises a frequency of 2 MHz.

5. The resonant gate drive circuit as recited in claim 1 wherein:
   said first winding and said second winding of said inductor comprise an equal number of turns.

6. The resonant gate drive circuit as recited in claim 1 wherein:
   said limiting means comprises a first diode coupled between said gate input of said power MOSFET and said voltage level of said power source and a second diode coupled between said gate input and said ground reference of said power source.

7. The resonant gate drive circuit as recited in claim 1 wherein:
   said inductor coupled to said gate input of said power MOSFET forms a resonant circuit with the equivalent gate capacitance of said power MOSFET.

8. The resonant gate drive circuit as recited in claim 1 wherein:
   said path for said second portion of a discharge current from said power MOSFET gate input provided by said first switching means returns energy to said power MOSFET. power source thereby increasing circuit efficiency.

9. The resonant gate drive circuit as recited in claim 1 wherein:
   said inductor provides a high impedance between said first switching means and said second switching means when said switching means are both conducting simultaneously.

10. A resonant gate drive circuit comprising:
    a power source;
    an inductor having a first winding and a second winding on each side of a center tap, said center tap being coupled to a gate input of a power MOSFET;
    a first MOSFET having a source and drain coupled between said power source and said first winding of said inductor for providing a path for a first portion of a charging current to said gate input of said power MOSFET and a path for a second portion of a discharge current from said gate input;
    a second MOSFET having a source and drain coupled between said second winding of said inductor and a ground reference of said power source for providing a path for a second portion of a charging current to said gate input of said power MOSFET and a path for a first portion of a discharge current from said gate input;
    an input signal coupled to a gate input of said first MOSFET and a gate input of said second MOSFET for controlling the switching of said first MOSFET and said second MOSFET
    a first limiting means coupled between said gate input of said power MOSFET and said power source for limiting a voltage level at said gate input of said power MOSFET to the voltage level of said power source; and
    a second limiting means coupled between said gate input of said power MOSFET and said power source for limiting said voltage level at said gate input of said power MOSFET to the ground reference of said power source.

11. The resonant gate drive circuit as recited in claim 10 wherein:
    said first MOSFET and said second MOSFET comprises an enhancement mode MOSFET.

12. The resonant gate drive circuit as recited in claim 10 wherein:
    said input signal comprises a frequency of 2 MHz.

13. The resonant gate drive circuit as recited in claim 10 wherein:
    said first winding and said second winding of said inductor comprise an equal number of turns.

14. The resonant gate drive circuit as recited in claim 10 wherein:
    said inductor coupled to said gate input of said power MOSFET forms a resonant circuit with the equivalent gate capacitance of said power MOSFET.

15. The resonant gate drive circuit as recited in claim 10 wherein:
    said path for said second portion of a discharge current from said power MOSFET gate input provided by said first switching means returns energy to said power source thereby increasing circuit efficiency.

16. The resonant gate drive circuit as recited in claim 10 wherein:
said inductor provides a high impedance between said first MOSFET and said second MOSFET when both are conducting simultaneously.

17. A method for providing a resonant gate drive circuit with energy recovery comprising the steps of:
providing a power source;
providing an inductor having a first winding and a second winding on each side of a center tap;
coupling said center tap to a gate input of a power MOSFET;
providing a path for a first portion of a charging current to said gate input of said power MOSFET and a path for a second portion of a discharge current from said gate input with a first switching means coupled between said power source and said first winding of said inductor;
providing a path for a second portion of a charging current to said gate input of said power MOSFET and a path for a first portion of a discharge current from said gate input with a second switching means coupled between said second winding of said inductor and a ground reference of said power source;
controlling said first switching means and said second switching means with an input signal; and
limiting a voltage level at said gate input to a voltage level of said power source and said ground reference with means coupled to said gate input of said power MOSFET.

18. The method as recited in claim 17 wherein said step of controlling said first switching means and said second switching means with an input signal includes a 2 MHz input signal.

19. The method as recited in claim 17 wherein said step of limiting a voltage level at said power MOSFET gate input comprises the steps of coupling a first diode between said power MOSFET gate input and said voltage level of said power source and coupling a second diode between said power MOSFET gate input and said ground reference.

20. The method as recited in claim 17 wherein said step of providing an inductor comprises the step of forming a resonant circuit with said inductor and an equivalent gate capacitance of said power MOSFET.

* * * * *